United States Patent [19]

Glover

[11] Patent Number: 4,714,884

[45] Date of Patent: Dec. 22, 1987

[54] METHOD OF ELIMINATING EFFECTS OF SPURIOUS NMR SIGNALS CAUSED BY IMPERFECT 180 DEGREE RF PULSES

[75] Inventor: Gary H. Glover, Delafield, Wis.

[73] Assignee: General Electric Company, Waukesha, Wis.

[21] Appl. No.: 47,554

[22] Filed: Apr. 27, 1987

Related U.S. Application Data

[63] Continuation of Ser. No. 873,797, Jun. 13, 1986, abandoned.

[51] Int. Cl.[4] .............................................. G01R 33/20
[52] U.S. Cl. .................................................... 324/309
[58] Field of Search ............... 324/300, 307, 309, 311, 324/312, 313, 314

[56] References Cited

U.S. PATENT DOCUMENTS

| | | | |
|---|---|---|---|
| 4,443,760 | 4/1984 | Edelstein et al. | 324/309 |
| 4,484,138 | 11/1984 | Bottomley et al. | 324/309 |
| 4,521,733 | 6/1985 | Bottomley et al. | 324/309 |
| 4,553,096 | 11/1985 | Randell | 324/309 |

OTHER PUBLICATIONS pp. 22–30 from Reference Book entitled "Pulse and Fourier Transforms NMR".
1982 General Electric Brochure entitled "NMR—A Perspective on Imaging".

*Primary Examiner*—Stewart J. Levy
*Assistant Examiner*—Kevin D. O'Shea
*Attorney, Agent, or Firm*—Leydig, Voit & Mayer

[57] ABSTRACT

In an NMR imaging method employing multiple spin-echo pulse sequences, a method is disclosed for eliminating ghosting artifacts in an NMR image. The method comprising the steps of (1) maintaining a static magnetic field along a first axis of an NMR imaging sample, (2) exciting a plurality of nuclear spins in a region of said NMR sample by irradiating said sample with an RF pulse, (3) irradiating said NMR sample with a series of 180° RF pulses such that each RF pulse inverts the orientation of a first group of the excited nuclear spins by 180°, whereupon inherent imperfections in at least one of the 180° pulses cause a second group of excited nuclear spins to change orientation by an angle other than 180°, (4) applying first and second magnetic field gradient pulses to the NMR sample before and after, respectively, the application of at least one of the 180° RF pulses thereby causing no net accumulation of phase in the first group of excited nuclear spins, (5) applying an imaging gradient after the 180° RF pulse in order to focus the plurality of nuclear spins and thereby create an NMR spin-echo signal, (6) sampling the NMR signal during a predetermined time interval between 180° pulses in order to detect the spin-echo signal; and (7) modulating each pair of first and second magnetic field gradients with respect to other pairs associated with the series of 180° RF pulses in order to prevent refocusing of the second group of nuclear spins for the duration of all of the time intervals during which the NMR signal from the sample is detected for the purpose of constructing an image.

31 Claims, 7 Drawing Figures

METHOD OF ELIMINATING EFFECTS OF SPURIOUS NMR SIGNALS CAUSED BY IMPERFECT 180 DEGREE RF PULSES

This is a continuation of co-pending application Ser. No. 873,797 filed on June 13, 1986 now abandoned.

FIELD OF THE INVENTION

The present invention relates generally to nuclear magnetic resonance (NMR) imaging methods employing multiple spin-echo pulse sequences. More particularly, the invention relates to the elimination of ghost images resulting from image methods employing multiple spin-echo pulse sequences.

BACKGROUND

It is well known that NMR imaging methods utilize a combination of pulsed magnetic field gradients and pulsed RF magnetic fields to obtain NMR imaging information from nuclear spins situated in a selected region of an imaging sample. In several well-known methods, the pulsed RF magnetic fields involve multiple spin-echo RF pulse sequences. Most NMR methods employing multiple spin-echo pulse sequences utilize Carr-Purcell-Meiboom-Gill (CPMG) methods.

The CPMG methods involve the application of a 90°:τ:180°:2τ:180:2τ:180:2τ:180, etc., RF pulse sequence wherein the phase of the 180° pulses is rotated by 90° with respect to the phase of the 90° pulse. Before the pulse sequence is applied, the nuclear magnets are at equilibrium such that they generate a net nuclear magnetization M aligned with the direction of an applied static field $B_o$. For the purpose of explaining the effect of the RF pulse sequence on the nuclear magnetization M, the direction of the static field $B_o$ is typically chosen as the z-axis in a Cartesian coordinate system rotating at the Larmor frequency $\omega_o$. Viewing the Cartesian coordinate system at the frequency $\omega_o$ so that the system appears stationary, the initiated 90° pulse of the CPMG methods cause the magnetization M to rotate 90° (hence the name "90°" pulse) into the x-y plane defined by the x and y axes of the Cartesian coordinate system. Subsequent application of the 180° pulses causes the magnetization M to rotate through 180° about the excitation axis.

In NMR imaging, magnetic field gradients are necessary to encode spatial information into the NMR signal. Because of these magnetic field gradients, the value of $B_o$ is not constant and therefore not all of the nuclear spins comprising the magnetization M have the same frequency.

Again considering the Cartesian coordinate system rotating at the Larmor frequency $\omega_o$, the change in frequency caused by the spatial encoding of the magnetic field gradients causes the nuclear spins comprising the magnetization M to dephase after they have been rotated into the x-y plane by the 90° RF pulse. By rotating the nuclear spins about a transverse axis in response to the application of a 180° pulse, the dephasing effect is reversed and the nuclear spins pass through an in-phase position and then again begin to dephase. Application of subsequent 180° pulses will cause the spins to again focus or become in-phase. Because of this rephasing characteristic, 180° pulses used in spin-echo applications are often known as time reversal pulses.

When the spins focus in the x-y or transverse plane, an NMR signal can be detected by a receiver coil positioned to be sensitive along the transverse plane. The refocused magnetization M is commonly referred to as a "spin echo". Unfortunately, in the CPMG imaging methods where multiple spin-echo sequences are employed, the effects of imperfect 180° pulses can be severe, and in practice the 180° pulses are rarely ideal.

For the purpose of understanding its imaging effects, an imperfect 180° pulse may be thought of as a composite of 0°, 90° and 180° pulses. Following the foregoing example, the 0° pulse component will not rotate a group of nuclear spins and, of course, the 90° pulse component rotates the spins 90° in the Cartesian coordinate system. Just as each imperfect 180° pulse may be thought of as a composite of 0°, 90° and 180° pulses, the magnetization M may be thought of as being comprised of groups of spins (isochromats) that are affected by the imperfect 180° pulse as if the pulse is a composite of 0°, 90° and 180° pulses. Specifically, some groups of spins or isochromats may be considered to be affected by the imperfect 180° pulse as if it were a perfect 180° pulse. Other groups of spins may be affected as if the pulse was a 90° pulse. And still other groups of spins may be affected as if the pulse was a 0° pulse. Viewing the effect of the imperfect 180° pulse in this manner, the ghosting artifacts generated by an imperfect 180° pulse may be considered to be associated with 0° and 90° pulses.

SUMMARY OF THE INVENTION

It is a general object of the invention to provide an improved NMR imaging method which eliminates ghost images caused by the refocusing of nuclear spins excited by an imperfect portion of a 180° RF pulse.

It is a more particular object of the invention to prevent refocusing of nuclear spins excited by the imperfect portions of a 180° RF pulse during the time of data acquisition.

It is another object of the invention to minimize distortion of an NMR image generated by imaging methods using multiple imperfect 180° RF pulses wherein the 180° component of the RF pulse is allowed to function undisturbed, but the 0° and 90° components are altered in order to prevent refocusing of their associated nuclear spins during the times of data acquisition.

In an NMR imaging method employing multiple spin-echo RF pulse sequences, the invention prevents the formation of ghost images caused by imperfect time reversal RF pulses by (1) applying first and second magnetic field gradient pulses before and after, respectively, a first imperfect RF pulse, wherein the first and second magnetic field gradient pulses have equal (time integral) areas and the same polarity, (2) applying third and fourth magnetic field gradient pulses before and after, respectively, a next time reversal RF pulse wherein the third and fourth magnetic field gradient pulses have equal areas and the same polarity, but their polarity is reversed from that of said first and second magnetic field gradient pulses and (3) applying a pair of gradient pulses of equal area and the same polarity before and after, respectively, each successive RF pulse, wherein the area of each pulse differs from the area of any previous pulse pair, and the polarity alternates between successive RF pulses.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
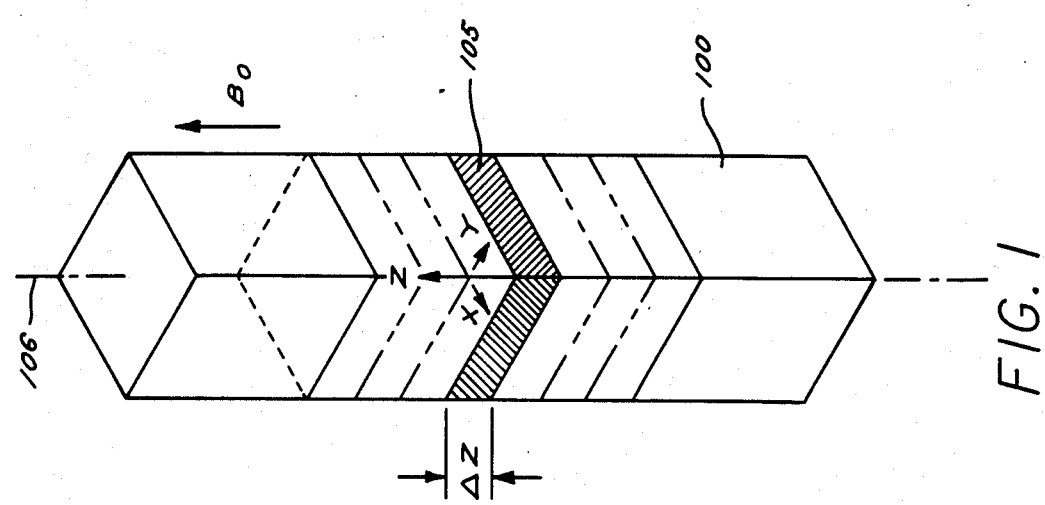
FIG. 1 depicts an NMR imaging sample situated in a static magnetic field and having a planar imaging volume defined therein by selective excitation.

The NMR imaging pulse sequences produced by the invention will be best understood if initial reference is made to FIG. 1 which depicts an imaging sample 100 situated in a static homogeneous magnetic field $B_o$ directed in the positive Z-axis direction of the Cartesian coordinate system. The Z-axis is selected to be coincident with the long or cylindrical axis 106 of sample 100. The origin of the coordinate system is taken to be the center of imaging sample 105. A single planar image corresponding to sample 105 can be constructed using the spatial information obtained with the use of the pulse sequences depicted in FIGS. 2-6.

In order to better appreciate the present invention, the pulse sequence depicted in FIG. 2 will be described first. This pulse sequence is an exemplary CPMG-type sequence useful in two-dimensional Fourier transform (2DFT) imaging. It will be appreciated that other particular imaging methods which incorporate the CPMG-type sequence, such as multiple-angle projection methods or three-dimensional Fourier transform methods, will also benefit from the invention. Since application of the invention to other imaging methods is straightforward once its application in a particular method is understood, only the illustrated 2DFT imaging method will be discussed in detail.

In the illustrated pulse sequence, the imaging sample is positioned in a static magnetic field $B_o$, which field is accordingly omitted from all of the figures depicting NMR pulse sequences. In each pulse sequence, gradients in the magnetic field are necessary to produce spatial localization of the NMR signal. Typically, three such gradients are necessary:

$$G_x(t) = \partial B_o / \partial x \quad (1)$$

$$G_y(t) = \partial B_o / \partial y \quad (2)$$

$$G_z(t) = \partial B_o / \partial z \quad (3)$$

The $G_x$, $G_y$, and $G_z$ gradients are constant throughout the imaging volume 105, (FIG. 1), but their magnitudes are typically time dependent. The magnetic fields associated with the gradients are denoted, respectively, $b_x$, $b_y$, and $b_z$, wherein $$b_x = G_x(t)x \quad (4)$$

$$b_y = G_y(t)y \quad (5)$$

$$b_z = G_z(t)z \quad (6)$$

within the imaging volume.

Figure 2:
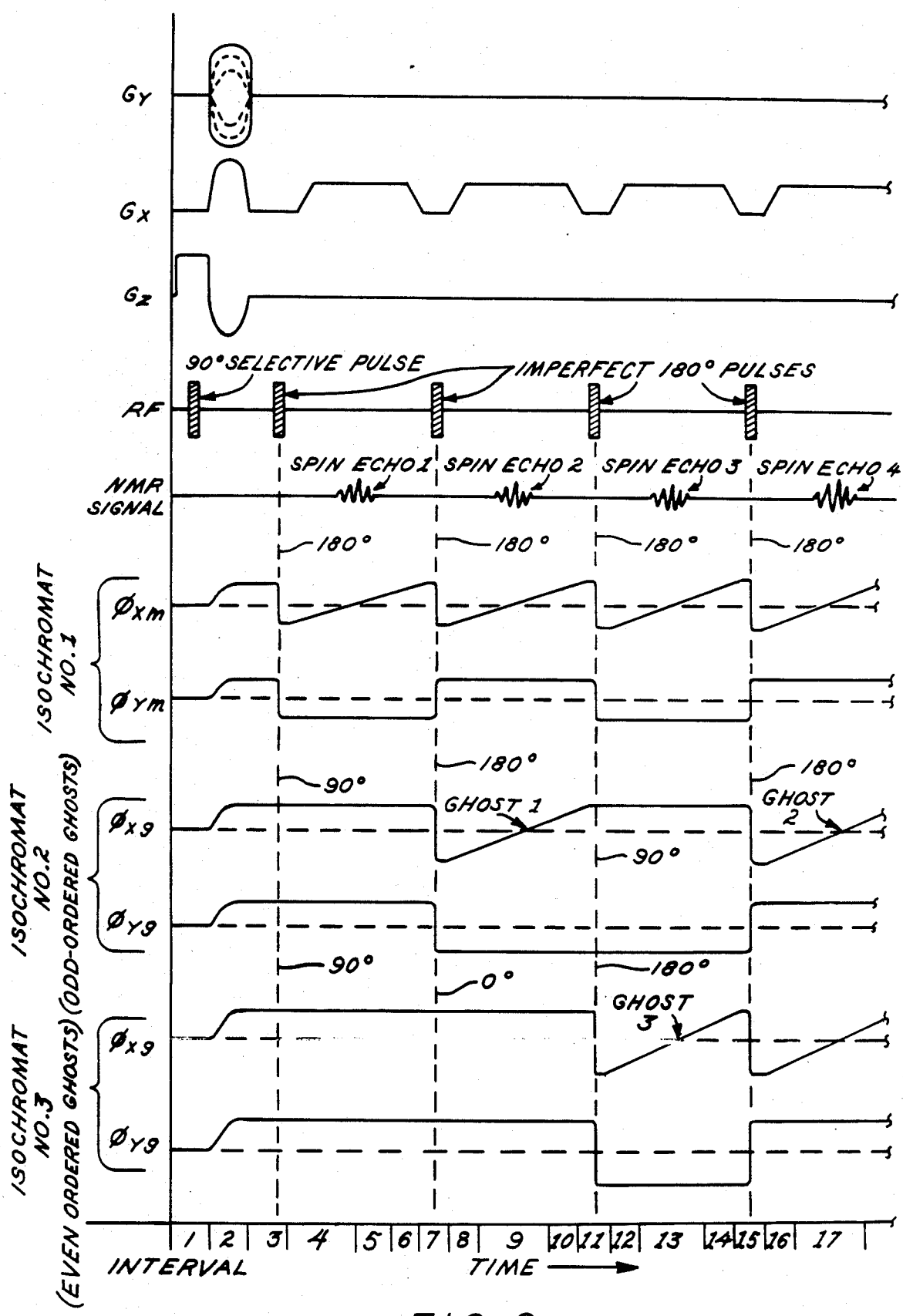
FIG. 2 depicts an exemplary CPMG-type pulse sequence used to produce the NMR imaging data for production of a traverse image of the sample in FIG. 1, using well-known imaging methods wherein the phases of three groups of nuclear spins are illustrated.

Selection of planar section 105 of nuclear spins is accomplished during interval 1 shown on the horizontal axis of FIG. 2. In this interval, a positive magnetic field gradient $G_z$ is applied so that the imaging sample 100 (FIG. 1) is subjected to a total magnetic field in the Z-axis direction composed of the gradient $G_z$ and static magnetic field $B_o$. Approximately at the midpoint of interval 1, the sample is irradiated with a selective 90° RF pulse with a frequency content selected so as to preferentially excite nuclear spins in planar section 105 (FIG. 1) in which the magnetic field strength is as predicted by the Larmor equation. Nuclear spins outside region 105 remain substantially unaffected by this RF pulse. The "selective" nature of the 90° RF pulse is thus apparent.

At the end of interval 1 in FIG. 2, nuclear spins in planar section 105 have been rotated into the transverse plane, and although they precess at nominally the same frequency, they are out of phase with one another due to the dephasing effect of $G_z$ during the second half of interval 1. The nuclear spins are rephased in interval 2 by the application of a negative $G_z$ gradient related to the positive $G_z$ gradient in interval 1 such that $$\int_2 dt G_z \approx -\tfrac{1}{2} \int_1 dt G_z \quad (7)$$

where $$\int_2$$

is the integral with respect to time of the waveform of gradient $G_z$ over interval 2 and $$\int_1$$

is the integral with respect to time of the waveform of gradient $G_z$ over interval 1.

Simultaneously with the application of the negative $G_z$ gradient in interval 2, a phase encoding $G_y$ gradient having one of $n_y$ different amplitudes (as indicated by the dashed lines) is applied. The $G_y$ gradient encodes spatial information in the Y-axis direction by introducing a twist in the orientation of the nuclear spins by an integral multiple of $2\pi$ over the total length of the sample 100 in the Y-axis direction.

Figure 3:
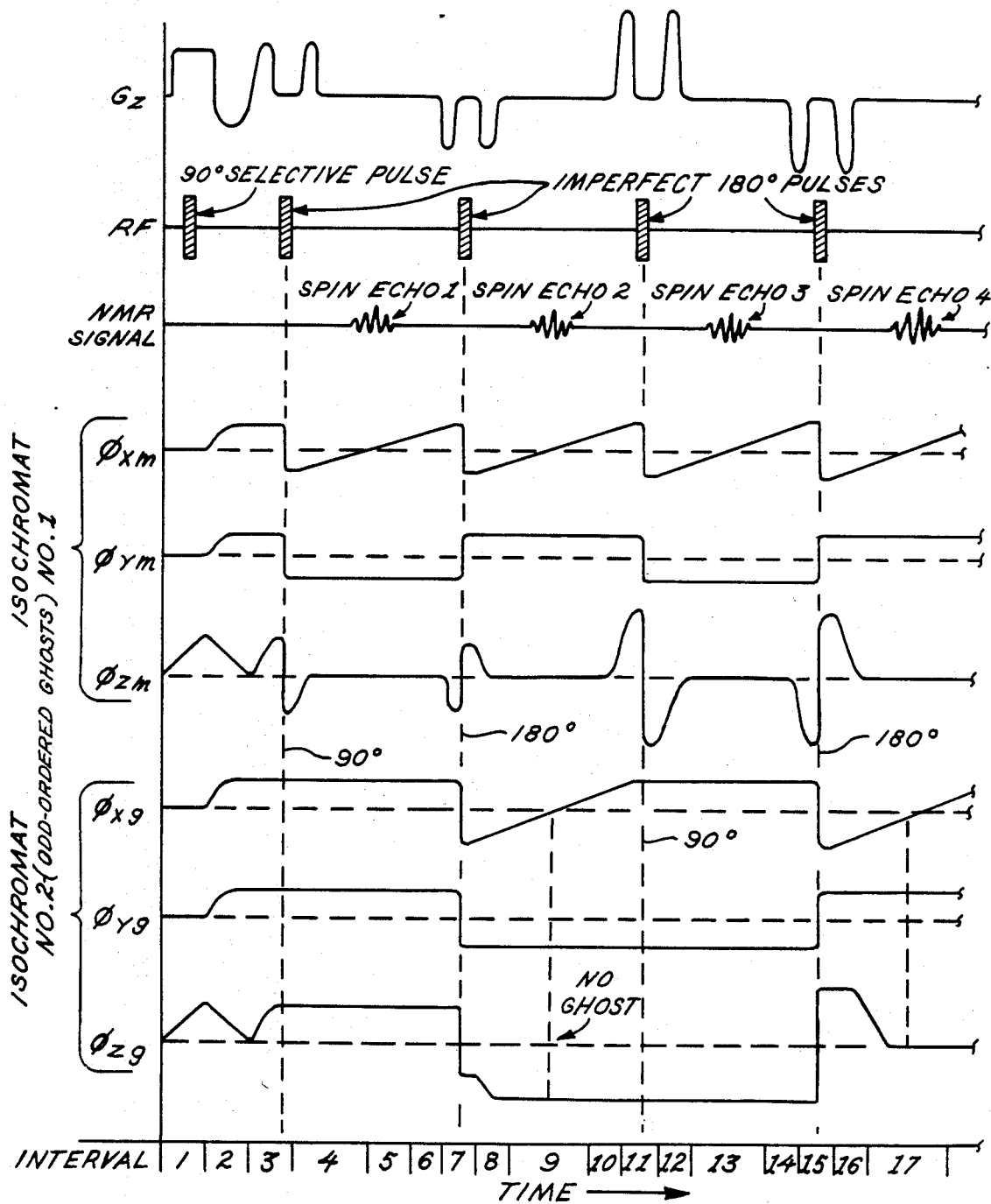
FIG. 3 depicts the pulse sequence of FIG. 2 modified to incorporate the preferred embodiment of the invention and illustrates the effect of the invention on the phases of the first and second group of spins.
Figure 4:
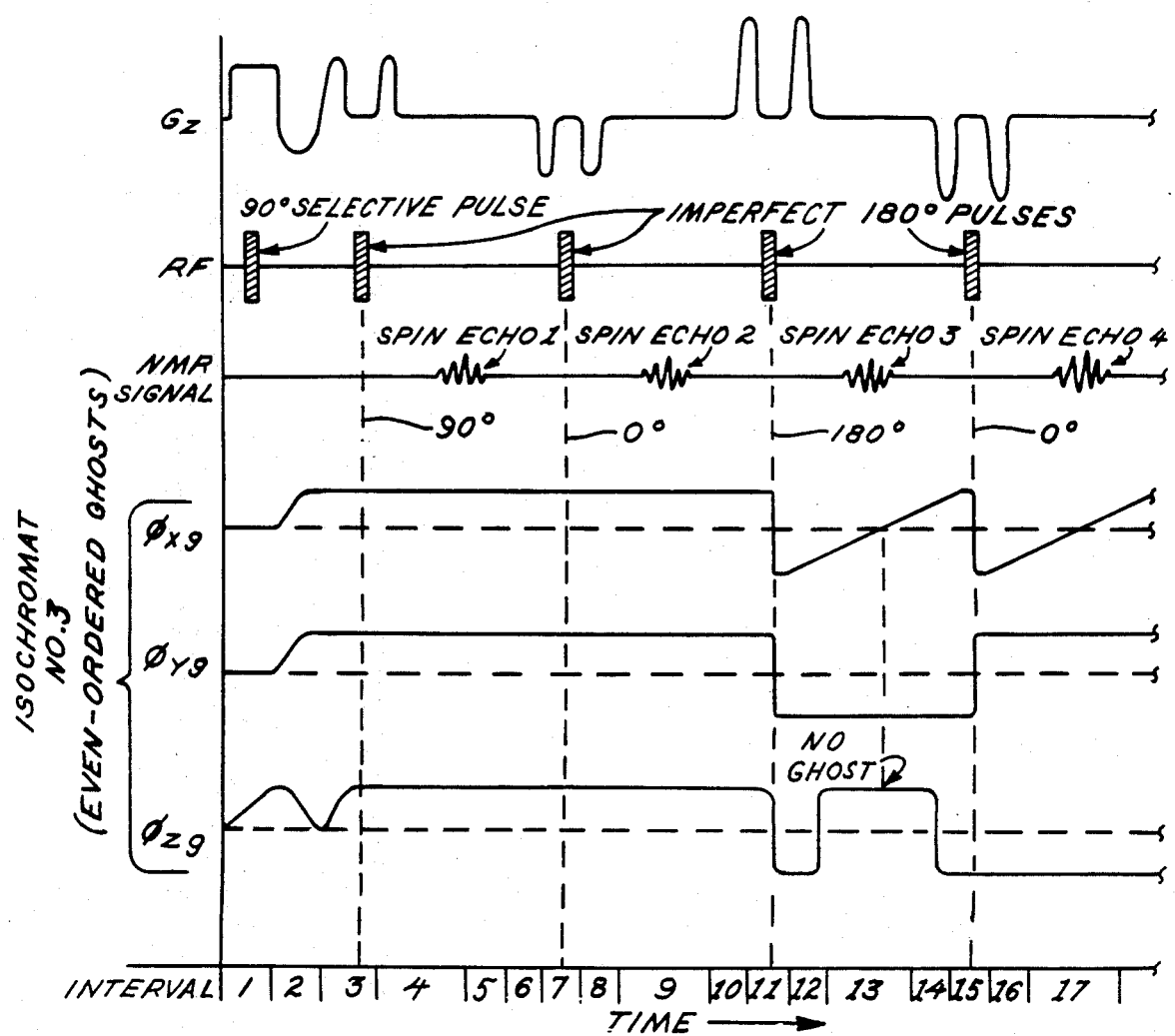
FIG. 4 depicts the pulse sequence of FIG. 3 and illustrates the effect of the invention on the phase of the third group of spins.

Following application of the phase encoding gradient having minimum amplitude, for example, the nuclear spins are twisted into a one-turn helix. Each different amplitude of gradient $G_y$ introduces a different degree of twist (phase encoding). The number, $n_y$, of different amplitudes of the $G_y$ gradient is chosen to be equal to the number of pixels the reconstructed image will have in the Y-axis direction. Therefore, the pulse sequence of FIG. 3 is repeated for $n_y$ different amplitudes of the gradient $G_y$ to produce $n_y$ NMR spin echo signals in interval 5. In practice, the signals may be averaged several times prior to incrementing the amplitude of the $G_y$ gradient in order to improve the signal-to-noise ratio. Typically, $n_y$ is 128 or 256.

Also in interval 2, a positive $G_x$ magnetic field gradient is applied to dephase nuclear spins in the X-axis direction by a predetermined amount. The 180° RF pulse applied in interval 3 reverses the direction of nuclear spin dephasing so that the nuclear spins again rephase and produce the NMR spin-echo signal (intervals 4 and 5) which can be observed at a time when imaging gradient $G_x$ is constant.

The 180° RF pulse in interval 3 is applied (following a short time interval of between 0.1 and 1 millisecond to allow current in the gradient winding to subside) at a time $\tau_a$ following the application of the selective 90° RF pulse, wherein $\tau_a$ is the time period between the applications of the 90° and 180° RF pulses, typically about 5 milliseconds. The $G_x$ gradient in intervals 2 and 4 is selected such that the time integrated areas under the pulses during each interval are equal:

$$\int_2 G_x dt = \int_4 G_x dt \tag{8}$$

To introduce spatial discrimination in the x-axis direction, the nuclear spin echo signal in intervals 4 and 5 is sampled (in quadrature) $n_x$ times during this time interval in the presence of the imaging $G_x$ gradient, where $n_x$ is equal to the number of pixels the image has in the x-axis direction. Upon analysis by known discrete, 2DFT methods, imaging section 105 is divided into $n_x n_y$ pixels, which can be used to construct an image.

Because of imperfections in the first 180° RF pulse, spin echos 2, 3 and 4 include signals from refocusing nuclear spins that are not in synchronization with the main body of nuclear spins. Considering a group of spins from the main body of spins labeled isochromat number 1 in FIG. 2, each 180° pulse reverses the phase $\phi$ of the isochromat. The effect on the phase of the isochromat no. 1 from each of the magnetic gradients $G_x$ and $G_y$ is illustrated separately as $\phi_{xm}$ and $\phi_{ym}$, respectively, where the subscript "m" is intended to indicate the phase that gives the "main" or desired image. After application of the $G_z$ gradient pulses in intervals 1 and 2, the $\phi_{zm}$ contribution to the phase of the isochromats is zero and therefore $\phi_{zm}$ is not of interest; accordingly, it is not illustrated in FIG. 2.

As previously discussed, because of imperfections in the sequence of 180° RF pulses, ghosting artifacts occur in the resulting NMR image. Applicant has determined that these artifacts may be understood by considering some groups of isochromats to be affected by a 180° RF pulse as if it were a 90° or 0° pulse. Following this model, if each time reversal pulse may be considered to have three components, and there are several such pulses, then there are many combinations of pulse components which may produce spin echoes. Only that combination wherein the RF pulse components are all 180° components produces the desired (main) signal. All other combinations of RF pulse components produce signals which are considered spurious to the imaging process.

As an example of combinations of RF pulse components that produce spurious signals, FIG. 2 illustrates the $\phi_{xg}$ and $\phi_{yg}$ phase elements for an isochromat (Isochromat No. 2) that is affected by the first and third 180° pulses as if they were 90° pulses and by the second and fourth pulses as if they were 180° pulses. The subscript "g" for the phases $\phi_x$ and $\phi_y$ indicates this group of spins forms an image that is distinct from the main image; or in other words, a "ghost" image. Because of the 90° effect of the first 180° RF pulse, isochromat No. 2 does not focus in the first readout or imaging gradient $G_x$. Instead, the second 180° pulse effects a reversal of the phase of isochromat No. 2—as it should—and thereby causes the isochromat to focus (i.e., to reach a phase value of zero) during the second imaging gradient. Accordingly, because there has been no accumulation of phase from the time of the imperfect 180° pulse in interval 3, the image from the focusing of the isochromat No. 2 in the second imaging gradient is inverted with respect to the image formed by the main group of spins and also retrieved during the imaging gradient.

It will be appreciated from FIG. 2 that imperfect 180° pulses which cause an isochromat to refocus 1, 3, 5 . . . etc. 180° pulses later than intended will cause an inverted image. For purposes of further discussion, the ghosts that refocus after the occurrence of an odd number of imperfect 180° pulses will be hereinafter referred to as "odd-ordered ghosts".

A third group of nuclear spins, isochromat no. 3 in FIG. 2, are affected by the first imperfect 180° pulse as if it were a 90° pulse and by the second imperfect 180° pulse as if it were a 0° pulse. Accordingly, isochromat No. 3 does not accumulate phase for the first two 180° pulses. The 180° component of the third imperfect 180° pulse reverses the phase of the isochromat no. 3 as it should and the imaging gradient $G_x$ causes phase to accumulate until focusing occurs at the point labeled "ghost 3". Because the isochromat has not accumulated phase for an even number of 180° pulses, the focusing at interval 13 is in phase with the main image. But, unless the imaging gradients $G_x$ are perfectly matched, the NMR signal attributable to the isochromat no. 3 will cause a low-frequency beat that results in a diffraction of the image. These diffracted images will hereinafter be referred to as "even-ordered ghosts".

The particular phase waveforms of FIG. 2 are only intended to be exemplary of the type which may generate odd and even-order ghosts when groups of spins are subjected to imperfect 180° pulses. It will be appreciated that there are as many possible phase amplitude waveforms as there are combinations of 0°, 90° and 180° in a sequence of imperfect pulses. It will be further appreciated that a pulse sequence using a greater or lesser number of 180° pulses than the four pulses in the illustrated embodiment will have a corresponding greater or lesser number of possible phase waveform combinations. In any event, unintended refocusing of isochromats during a CPMG-type sequence may occur during readout gradients $G_x$ because of the imperfect nature of the 180° pulses.

According to one important aspect of the invention, phase-contributing magnetic field gradients associated with a multiple spin-echo sequence are modulated so as to prevent refocusing of ghost isochromats during the time window for sampling the NMR signal. More specifically, dephasing and refocusing magnetic field gradients associated with each 180° pulse are made to have total phase contributions (areas under the pulses) that are opposite those arising from the dephasing and refocusing gradients of any subsequent odd-ordered 180° pulse. In addition, the dephasing and refocusing gradients associated with each 180° pulse have a total phase contribution unequal to those arising from dephasing and refocusing gradients of any subsequent even-ordered 180° pulse. The foregoing relationships prevent refocusing of both even-ordered and odd-ordered ghosts. This can be effected in either the $G_x$ or $G_z$ gradient directions, and by either time or amplitude modulation. As used herein, the term "odd-ordered" 180° pulses refers to the first, third, etc. pulses following a referenced 180° pulse whereas the term "even-ordered" 180° pulse refers to the second, fourth, etc. pulses.

In U.S. Pat. No. 4,484,138 to Bottomley et al., assigned to the assignee of the present invention, a method is disclosed for eliminating the effects of a spurious free induction decay (FID) NMR signal due to imperfect 180° RF pulses. The method provides for applying a large magnitude, short duration magnetic field gradient pulses, immediately preceding and following the 180° pulse. The gradient pulse preceding the 180° RF pulse is referred to as the "primer" pulse whereas the gradient pulse following the 180° RF pulse is referred to as the "crusher" pulse. Each gradient pulse in a primer-crusher pair have equal amplitudes so that with an ideal 180° pulse, dephasing caused by the primer pulse is cancelled by the crusher pulse. Accordingly, no net dephasing occurs unless an isochromat is first introduced in the transverse x-y plane by imperfections in the 180° pulse. These isochromats are dephased by the crusher gradient pulse such that a noticeable FID NMR signal will not occur. The Bottomley et al. patent is incorporated herein by reference.

In keeping with the invention, the primer-crusher pairs are alternated between positive and negative amplitudes in order to prevent refocusing of odd-ordered ghosts during the A/D window of an imaging gradient. In the preferred embodiment of the invention shown in FIG. 3, the primer and crusher pairs are further modified so that in addition to alternating between positive and negative values, the even-ordered pairs following a particular pair have an increased contribution to the phase of the excited spins.

In the illustrated embodiment of a four-pulse sequence, the primer-crusher pairs are preferably ordered such that the first pair is of lesser area than the third and the second pair is of lesser area than the fourth. Specifically, the first primer-crusher pair preferably has one half the total area of the third primer-crusher pair and the second pair has one half the total area of the fourth. The amplitudes of each primer-crusher pair may thus be represented as (0.5, −0.5, 1.0, −1.0) for this exemplary 4-pulse sequence. For a sequence having less than 4 pulses, the amplitude sequence is truncated, viz., for 3 pulses one would have (0.5, −0.5, 1.0). For more than 4 pulses, the preferred amplitude sequence may be represented as $(1/N', -1/N', 2/N', -2/N', \ldots 1, -1)$, where N is the number of RF pulses in the sequence and $$N' = N/2 \text{ if N is even; and } (N+1)/2, \text{ if N is odd.} \qquad (9)$$

While the above sequence is one example of amplitude values which, for constant width pulses, provides reduction of ghost signals, it should be understood that any sequence for which contiguous pairs of elements have equal magnitude and opposite sign and for which amplitudes of pairs have monotonically increasing values towards the end of the sequence, will be satisfactory. Applicant has determined that the reverse pattern wherein the pulse pair of larger area is first in time may result, for a certain sequence (90°, 0°, 0°, 180°) of imperfect 180° pulses, in an even-ordered ghost in spin echo 4.

While the above discussion has described the sequence variation in terms of pulse amplitude modulation, it must be further understood that the salient feature of the gradient pulse which must be modulated is the area under the pulse. Thus either amplitudes or pulse width, or both may be varied in accordance with the preceeding discussion.

By introducing the primer-crusher pairs as shown in FIG. 3, the phase of isochromat no. 1 includes an effect from the gradient $G_z$ as indicated by the phase amplitude waveform $\phi_{zm}$. In isochromat no. 2, the non-zero value of the $\phi_{zg}$ in interval 9 prevents the value of the isochromatic phase excluding the intentional y phase encoding $(\phi_{xg} + \phi_{zg})$ from being zero during the readout intervals 5, 9, 13, 17 . . . and the resulting generation of an NMR signal contributing to spin echo 2. In interval 17, the echo which rephases from isochromat 2 is actually in phase with the main echo and thus contributes useful signals. For even-ordered ghosts, the primer-crusher pairs according to the invention prevent $\phi_{zg}$ of isochromat no. 3 from refocusing at interval 13 in FIG. 4, thereby preventing the occurrence of the ghost 3 (FIG. 2).

Figure 5:
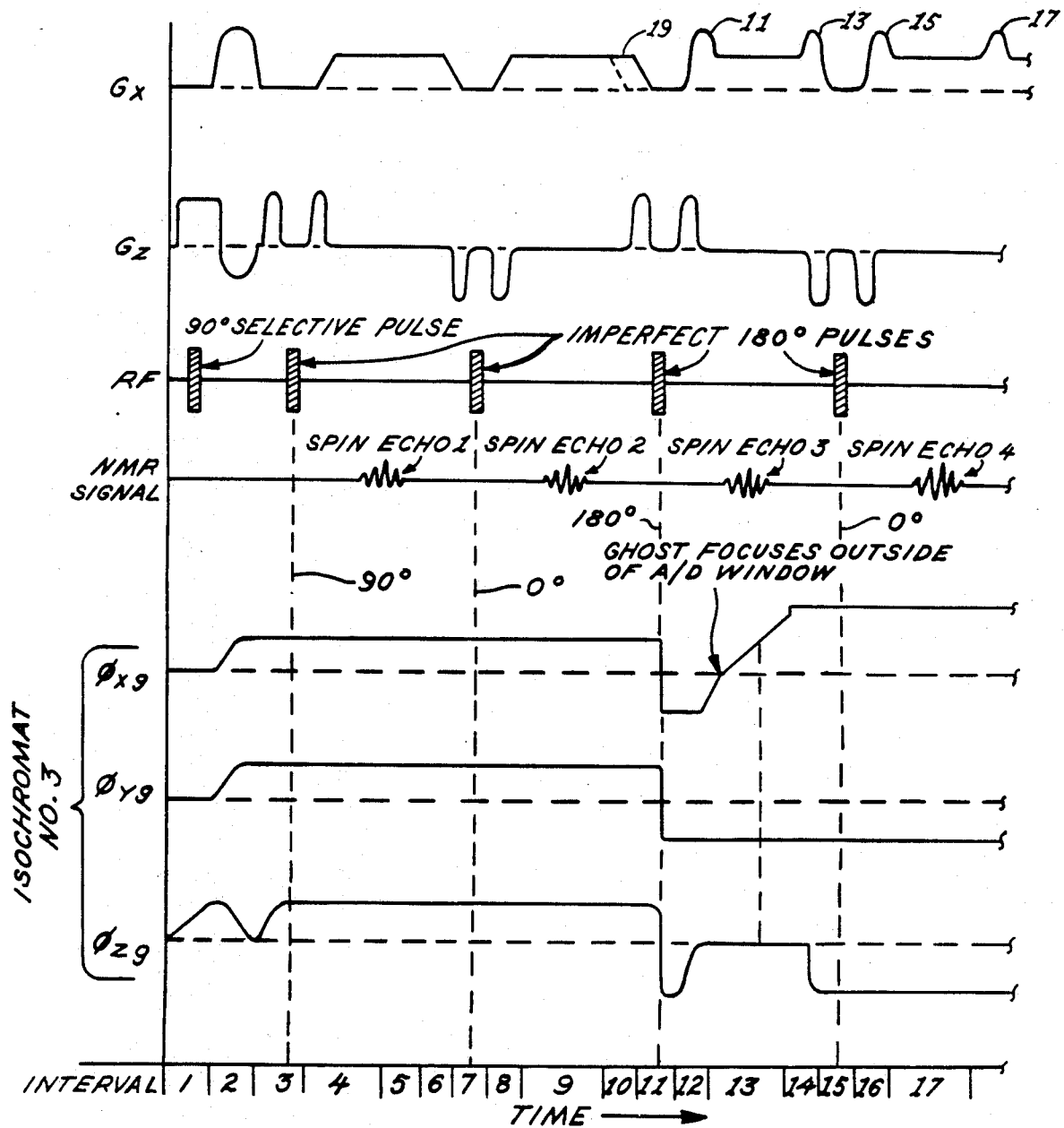
FIG. 5 depicts a CPMG-type pulse sequence incorporating the invention according to an alternative embodiment and illustrates the effect of the alternative embodiment on the phase of the third group of spins.

Referring to FIG. 5, an alternative embodiment of the invention provides for modulation of the imaging gradient $G_x$ in order to prevent refocusing of even-ordered ghosts. Odd-ordered ghosts are dealt with by the alternating signs of the primer-crusher pairs in the $G_z$ gradient. Unlike FIG. 3, each primer-crusher pair may provide the same phase contribution—i.e., equal areas under the pairs of pulses. The influence of the alternating primer-crusher pairs contributes to the phase of an isochromat that can potentially form an odd-ordered ghost in a manner similar to that shown by isochromat no. 2 in FIG. 3.

For even-ordered ghosts, the phase of isochromat no. 3 may be affected as illustrated in FIG. 5. The high-amplitude pulses 11, 13, 15 and 17 leading into and following the third and fourth imaging gradients of $G_x$ affect the $\phi_{xg}$ phase component of the isochromat no. 3 in a manner that prevents refocusing of the ghost 3 (of FIG. 2) in the A/D window of the imaging gradient in time interval 13. Specifically, the phase $\phi_{xg}$ is refocused in time interval 12 by the leading pulse 11. In order to balance the dephasing effect of pulse 11, the imaging gradient 19 preceding the pulse is extended past the point it normally ends (the dashed line) such that the extension of the imaging gradient has a phase contribution equal to that of the pulse 11. Of course, as an alternative to increased amplitude of the pulses 11, 13, 15 and 17, they may instead be time expanded so as to have amplitudes equal with the associated imaging gradient much like the extension of gradient pulse 19.

Even though the equal areas of the primer-crusher pairs allow the phase $\phi_{zg}$ of the isochromat no. 3 to have a zero value at interval 13, the premature refocusing caused by the pulse 11 in the $G_x$ gradient prevents the imaging of ghost 3. As can be appreciated from FIG. 5, the pulse 13 following the leading pulse 11 adjusts the phase $\phi_{xg}$ so that if the next pulse is effective as a 180° pulse, the isochromat will return to a normal phase condition.

Figure 6:
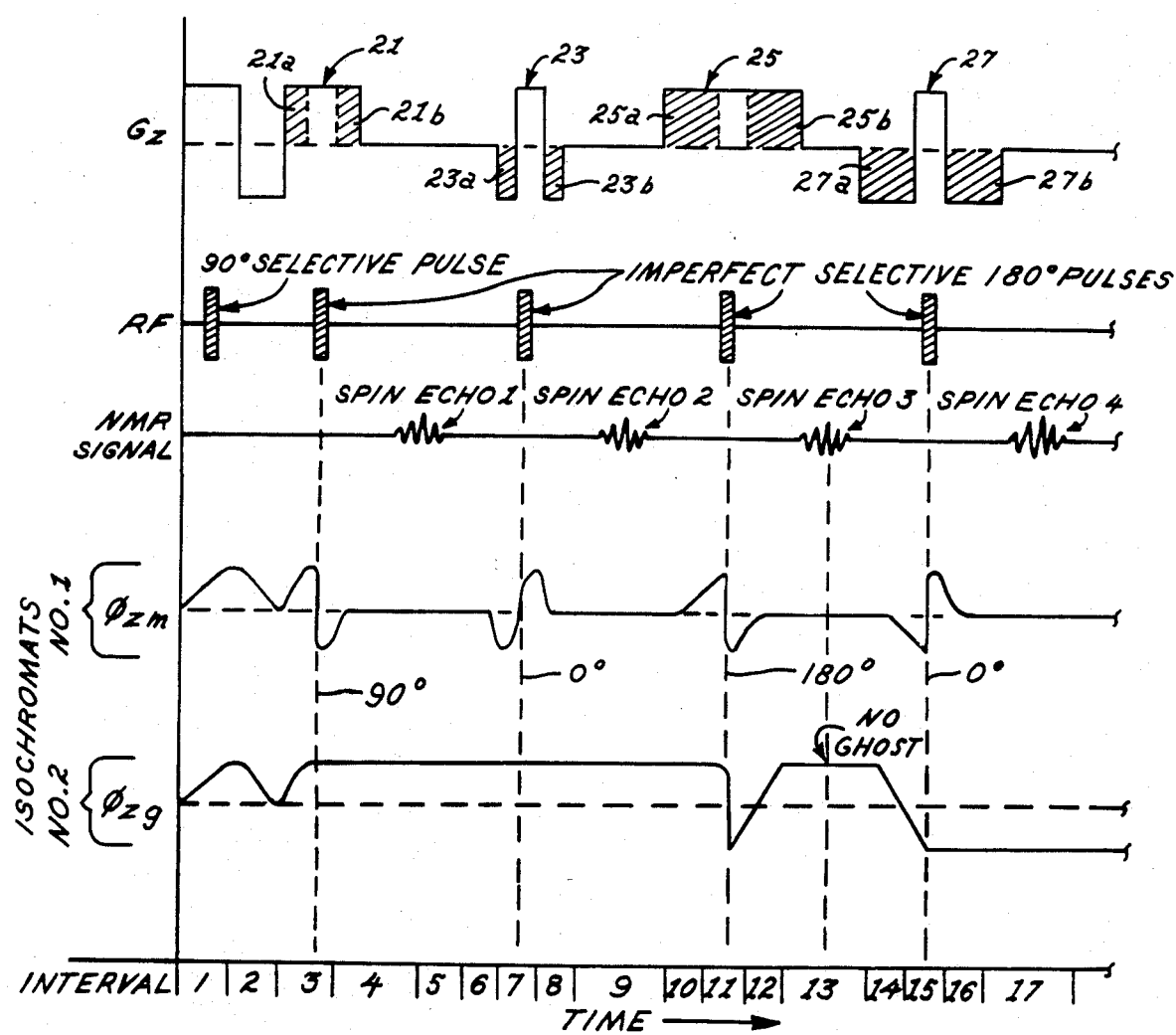
FIG. 6 depicts a CPMG-type pulse sequence according to another alternative embodiment of the invention and illustrates the effect of this alternative embodiment on the phase of the third group of nuclear spins.

For CPMG-type imaging methods employing selective 180° pulses, FIG. 6 illustrates an alternative embodiment of the invention wherein the primer-crusher pulses along the $G_z$ gradient associated with each selective 180° pulse are modulated in order to prevent ghosts as in the non-selective modes illustrated in FIGS. 2–5. For this embodiment of the invention, the same analysis applies as previously discussed in connection with the other embodiments. Specifically, the amplitude and/or time duration of the primer-crusher pairs are modulated so that they alternate in sign and increase in total time-integrated area. Thus, each of the pulses 21, 23, 25 and 27 is a composite of a primer-crusher pair and the selective $G_z$ gradient. For example, pulse 21 includes a primer-crusher pair 21a and 21b indicated by the shaded portions of the pulse 21.

In order to prevent the occurrence of odd-ordered ghosts, the primer-crusher pair 21a and 21b in pulse 21 has the opposite polarity sign of the primer-crusher pairs 23a/23b, 27a/27b, and any other subsequent odd-ordered pairs. In order to prevent the occurrence of even-ordered ghosts, each even-ordered pair following a particular primer-crusher pair has a greater area than the particular primer-crusher pairs. For example, primer-crusher pair 21a/21b has a lesser phase contribution to isochromat 1 than primer-crusher pair 25a/25b, and primer-crusher pair 23a/23b has a lesser phase contribution than primer-crusher pair 27a/27b.

To illustrate the effect on the phase $\phi_m$ of the main-image isochromat no. 1 and the phase $\phi_g$ of the ghost-image isochromat no. 3 (even-ordered ghost), FIG. 6 includes the contribution to the phases from the $G_z$ gradients. The phase $\phi_{zm}$ of the isochromat no. 1, which is part of the main image, responds to each 180° pulse by reversing amplitude as shown. Accordingly, the value of $\phi_{zm}$ is zero during the imaging gradient $G_x$. As before, isochromat no. 3 sees the first two 180° RF pulses as 90° and 0° pulses, respectively. Therefore, the isochromat does not accumulate phase during pulses 21 and 23 of the $G_z$ gradient. At the time of the third 180° pulse, the amplitude of $\phi_{zg}$ of isochromat no. 3 is reversed and the second half of pulse 23 in the $G_z$ gradient prevents the spins from refocusing while the NMR signal is sampled during application of the imaging gradient.

Accordingly, when the composite pulse 25 has ended, the value of $\phi_{zg}$ is non-zero, and it remains non-zero throughout the time interval 13 wherein the spin echo 3 is sampled. The amplitude waveforms for $\phi_{xg}$ and $\phi_{yg}$ for isochromat no. 3 are as they appear in FIG. 2.

While the above description has been given with respect to a CPMG-like sequence wherein the time reversal pulses are intended to have nutation angles of 180°, there may be applications in which the time reversal pulses are intentionally set to an angle $\theta$ different from 180°. In such cases, the prior art ghosts are produced by the same mechanism described above for imperfect 180° pulses since the $\theta$ pulse decomposition into 0°, 90°, and 180° components still holds true even when the pulses are ideal (exactly $\theta$ everywhere within the subject volume of interest). Therefore, the inventive method is effective for arbitrary angle time reversal pulses, whether intended to be 180° or not.

Figure 7:
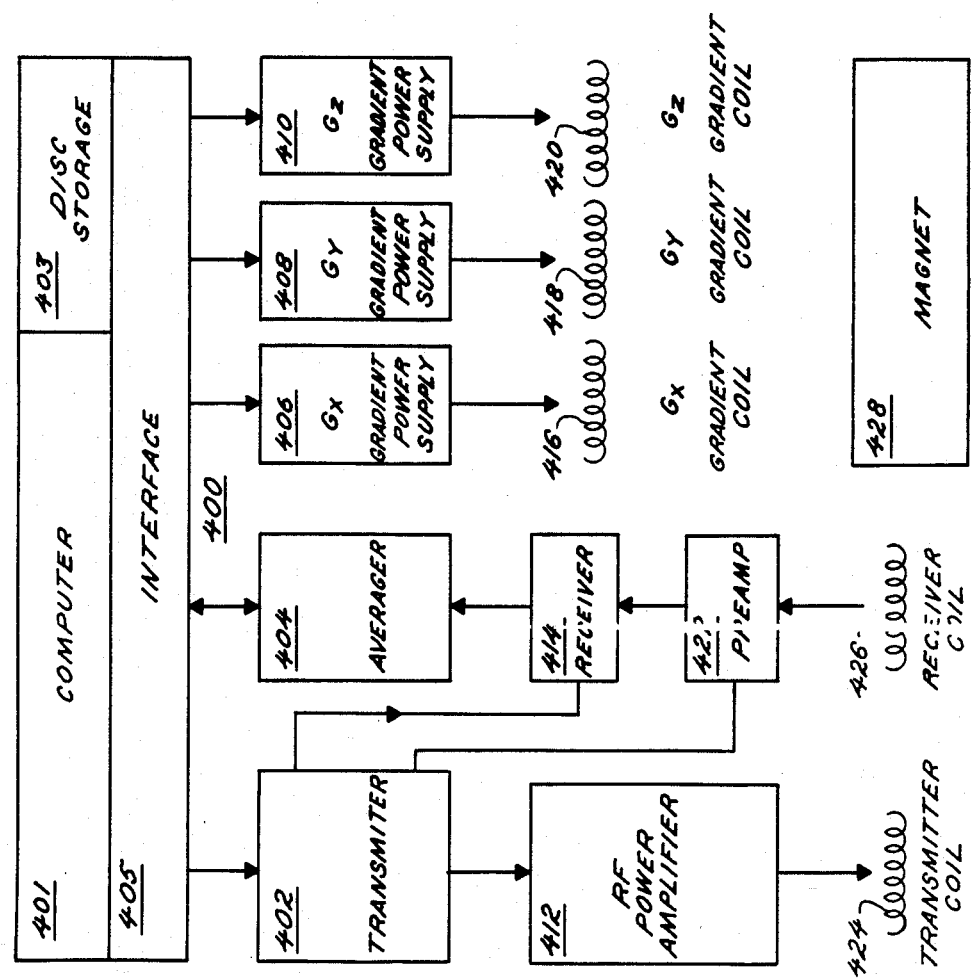
FIG. 7 illustrates a simplified block diagram of the major components of an NMR imaging apparatus suitable for producing the NMR pulse sequences shown in FIGS. 2-6.

FIG. 7 is a simplified block diagram of the major components of an NMR imaging system suitable for use with the NMR pulse sequences of the invention described herein. The system, generally designated 400, is made up of a general purpose mini-computer 401 which is functionally coupled to disk storage unit 403 and an interface unit 405. An RF transmitter 402, signal averager 404, and gradient power supplies 406, 408, and 410 for energizing, respectively, x, y, z gradient coils 416, 418, and 420 are coupled to computer 401 through interface unit 405.

RF transmitter 402 is gated with pulse envelopes from computer 401 to generate RF pulses having the required modulation to excite resonance in the object under study. The RF pulses are amplified in RF power amplifier 412 to levels varying from 100 watts to several kilowatts, depending on the imaging method, and applied to transmitter coil 424. The higher power levels are necessary for large sample volumes such as in whole body imaging, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses described herein, blanking for the preamplifier and RF power amplifier, and voltage waveforms for the gradient power supplies. The computer also performs data processing such as Fourier transforms, image reconstruction, data filtering, imaging display, and storage functions, all of which are operations conventionally performed by minicomputers and hence described herein only functionally.

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of the coils are orthogonal to the direction of the static magnetic field $B_o$ produced by magnet 428 (FIG. 7). The coils are isolated from the remainder of the system by enclosure in an RF shielded cage. The coils produce RF magnetic fields in the x direction.

Magnetic field gradient coils 416, 418, and 420 (FIG. 7) are necessary to provide gradients $G_x$, $G_y$, and $G_z$, respectively. In the imaging pulse sequences described herein, the gradients should be monotonic and linear over the sample volume.

From the foregoing, it will be apparent that the NMR pulse sequences in accordance with the invention provide improved NMR methods which eliminate the effects of spurious signals produced by imperfect 180° RF pulses. While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

I claim:

1. In an NMR imaging method employing multiple spin-echo pulse sequences, a method for eliminating ghosting artifacts in an NMR image comprising the steps of:
maintaining a static magnetic field along a first axis of an NMR imaging sample;
exciting a plurality of nuclear spins in a region of said NMR sample by irradiating said sample with an RF pulse;
irradiating said NMR sample with a series of 180° RF pulses such that each RF pulse inverts the orientation of a first group of said excited nuclear spins by 180°, whereupon inherent imperfections in at least one of said 180° pulses cause a second group of said excited nuclear spins to change orientation by an angle other than 180°;
applying first and second magnetic field gradient pulses to the NMR sample before and after, respectively, the application of at least one of the 180° RF pulses thereby causing no net accumulation of phase in the first group of excited nuclear spins;
applying an imaging gradient after said at least one 180° RF pulse in order to focus said plurality of nuclear spins and thereby create an NMR spin-echo signal;
sampling said NMR signal during a predetermined time interval between 180° pulses in order to detect said spin-echo signal; and
modulating each pair of first and second magnetic field gradients with respect to other pairs associated with said series of 180° RF pulses in order to prevent refocusing of said second group of nuclear spins for the duration of all of said time intervals during which the NMR signal from the sample is detected for the purpose of constructing an image.

2. The method of claim 1 wherein said RF pulse for exciting a plurality of nuclear spins in a region is a selective RF pulse applied in the presence of a third magnetic field gradient.

3. The method of claim 1 wherein the pairs of first and second magnetic field gradients include pairs of first components along said first axis that sequentially alternate in polarity in order to prevent the formation of ghost artifacts in an NMR image otherwise caused by the refocusing of said second group of excited nuclear spins during the detection time interval associated with the odd-ordered 180° pulses occurring subsequently to the imperfect 180° pulse that generated said second group.

4. The method of claim 3 wherein each first gradient pulse has a total time integral area equal to that of the second gradient pulse with which it forms a pair but unequal to the total time integral area of another first gradient pulse associated with any even-ordered 180° pulse subsequently occurring in the pulse sequence.

5. The method of claim 4 wherein each first gradient pulse has a total time integral area that is less than the total time integral area of another first gradient pulse associated with any even-ordered 180° pulse subsequently occurring in the pulse sequence.

6. The method of claim 3 including second components of said first and second magnetic field gradients occurring along a second axis orthogonal to said first axis in order to provide a total area by said first and second gradients that is greater than that provided by the first components alone, thereby preventing the refocusing of said second group of excited nuclear spins during the sampling time interval associated with the even-ordered 180° RF pulses subsequent to the imperfect 180° pulse that generated said second group.

7. The method of claim 6 wherein said imaging gradient occurs along said second axis.

8. In an NMR imaging method employing multiple spin-echo RF pulse sequences, a method for preventing the formation of ghost images caused by an imperfect RF pulse comprising the steps of:
maintaining a static magnetic field along a first axis of an NMR imaging sample;
exciting a plurality of nuclear spins in a region of said NMR sample by irradiating said sample with an RF pulse;
irradiating excited nuclear spins in an NMR sample with a series of RF pulses such that each RF pulse changes the orientation of a first group of said excited spins in said sample by a desired angle of $\theta°$, whereupon inherent imperfections in at least one of said RF pulses cause a second group of said excited spins in said sample to change its orientation by an angle other than $\theta°$;
applying at least one imaging gradient after each RF pulse in order to focus said excited spins;
applying first and second magnetic field gradient pulses before and after, respectively, said at least one imperfect RF pulse, wherein said first and second magnetic field gradient pulses are of equal time integral areas and the same polarity; and
applying third and fourth magnetic field gradient pulses before and after, respectively, each odd-ordered RF pulse following said imperfect RF pulse wherein said third and fourth magnetic field gradient pulses have equal time integral areas and the same polarity, but their polarity is reversed from that of said first and second magnetic field gradient pulses, whereby said second group of excited spins is prevented from focusing while the NMR signal is sampled during the application of the imaging gradient following each of said odd-ordered RF pulses.

9. The method of claim 8 including the steps of
applying fifth and sixth magnetic field gradient pulses before and after, respectively, each even-ordered RF pulse following said imperfect RF pulse wherein said fifth and sixth magnetic field gradient pulses have equal energies and the same polarity, and they have the same polarity as that of said first and second magnetic field gradient pulses but different total time integral areas, whereby said second group of excited nuclear spins is prevented from focusing while the NMR signal is sampled during the application of the imaging gradient following each of said even-ordered RF pulses.

10. The method of claim 9 wherein each of said fifth and sixth magnetic field gradient pulses has a total time integrated area that is greater than the total time integrated area of either said first or second magnetic field gradient pulses.

11. The method of claim 8 wherein said first, second, third and fourth magnetic field gradient pulses occur along said first axis.

12. The method of claim 10 wherein said first, second, third and fourth magnetic field gradient pulses occur along said first axis.

13. The method of claim 12 wherein at least a portion of each of said fifth and sixth magnetic field gradient pulses occurs along said first axis.

14. The method of claim 13 wherein said fifth and sixth magnetic field gradient pulses are composites of magnetic field gradient pulses occurring along said first axis and a second axis orthogonal to said first axis.

15. The method of claim 8 wherein said RF pulse for exciting a plurality of nuclear spins in a region is a selective RF pulse applied in the presence of a seventh magnetic field gradient.

16. In an NMR imaging method employing multiple spin-echo RF pulse sequences, a method for preventing the formation of ghost images caused by an imperfect RF pulse comprising the steps of:
maintaining a static magnetic field along a first axis of an NMR imaging sample;
exciting a plurality of nuclear spins in a region of said NMR sample by irradiating said sample with an RF pulse;
irradiating excited nuclear spins in an NMR sample with a series of RF pulses such that each RF pulse changes the orientation of a first group of said excited nuclear spins in said sample by a desired angle of 8°, whereupon inherent imperfections in at least one of said RF pulses cause a second group of said excited nuclear spins in said sample to change its orientation by an angle other than $\theta°$;
applying at least one imaging gradient after each RF pulse in order to focus said excited spins;
applying first and second magnetic field gradient pulses before and after, respectively, said at least one imperfect RF pulse, wherein said first and second magnetic field gradient pulses are of equal time integral areas and polarities; and
applying third and fourth magnetic field gradient pulses before and after, respectively, each even-ordered RF pulse following said imperfect RF pulse wherein said third and fourth magnetic field gradient pulses have equal time integral areas and the same polarity, and they have the same polarity as that of said first and second magnetic field gradient pulses but different total time integral areas whereby said second group of excited nuclear spins is prevented from focusing while the NMR signal is sampled during the application of the imaging gradient following each of said even-ordered RF pulses.

17. The method of claim 16 including the step of applying fifth and sixth magnetic field gradient pulses before and after, respectively, each odd-ordered RF pulse following said imperfect RF pulse wherein said fifth and sixth magnetic field gradient pulses have equal time integral areas and the same polarity, but their polarity is reversed from that of said first and second magnetic field gradient pulses, whereby said second group of excited spins is prevented from focusing while the NMR signal is sampled during the application of the imaging gradient following each of said odd-ordered RF pulses.

18. The method of claim 16 wherein each of said third and fourth magnetic field gradient pulses has a total energy that is greater than the total energy of either said first or second magnetic field gradient pulses.

19. The method of claim 17 wherein said first, second, fifth and sixth magnetic field gradient pulses occur along said first axis.

20. The method of claim 16 wherein at least a portion of each of said third and fourth magnetic field gradient pulses occurs along said first axis.

21. The method of claim 17 wherein at least a portion of each of said third and fourth magnetic field gradient pulses occurs along said first axis.

22. The method of claim 20 wherein at least one of said third and fourth magnetic field gradient pulses is a composite of magnetic field gradient pulses occurring along said first axis and a second axis orthogonal to said first axis.

23. The method of claim 21 wherein at least one of said third and fourth magnetic field gradient pulses is a composite of magnetic field gradient pulses occurring along said first axis and a second axis orthogonal to said first axis.

24. The method of claim 16 wherein said RF pulse for exciting a plurality of nuclear spins in a region is a selective RF pulse applied in the presence of a seventh magnetic field gradient.

25. A method of overcoming the effects of inherent imperfections in an NMR imaging method employing multiple spin-echo pulse sequences, said method comprising sequentially the steps of:
(a) maintaining a static magnetic field along a first axis of an NMR imaging sample;
(b) exciting, during a first predetermined time interval, a first plurality of nuclear spins in a region of said imaging sample with an RF pulse;
(c) applying for a second predetermined time interval a first magnetic field gradient pulse so as to provide a predetermined contribution to the phase of said excited nuclear spins;
(d) irradiating said imaging sample with a first 180° RF pulse during a third time interval, so as to initiate the rephasing of said excited nuclear spins, whereupon any inherent imperfections in said 180° RF pulse cause at least first and second groups of the excited nuclear spins in said imaging sample to change orientation by an angle other than 180°;
(e) applying a second magnetic field gradient during a fourth predetermined time interval, so as to cancel the dephasing effect of said first magnetic field gradient pulse on said excited nuclear spins except that said first and second groups of nuclear spins maintain a residue of phase contributed by said first magnetic field gradient;
(f) applying, during a fifth predetermined time interval, a first imaging gradient such that a nuclear spin-echo occurs, said nuclear spin-echo producing an NMR spin-echo signal;
(g) sampling said NMR spin-echo signal in the presence of said imaging gradient;
(h) applying for a sixth predetermined time interval a third magnetic field gradient pulse wherein said third magnetic field gradient pulse is of opposite polarity to said first magnetic field gradient pulse and provides a predetermined contribution to the phase of said excited nuclear spins;
(i) irradiating said imaging sample with a second 180° RF pulse during a seventh predetermined time interval so as to initiate another rephasing of said excited nuclear spins, whereupon the orientation of at least said first group of excited nuclear spins is changed by 180°;
(j) applying for an eighth predetermined time interval a fourth magnetic field gradient pulse wherein said fourth magnetic field gradient pulse cancels the effective phase contribution to said first group of spins from said third magnetic field gradient pulse but does not cancel the residue phase from said first magnetic field gradient pulse; and (k) applying during a ninth predetermined time interval, a second imaging gradient such that a NMR spin-echo signal occurs that is caused by the refocusing of the excited nuclear spins except that said residue phase of the first group of nuclear spins causes the first group of spins to not refocus while the NMR signal is sampled, thereby preventing the formation of an image from said first group of nuclear spins.

26. The method of claim 25 including the steps of, (1) applying for a tenth predetermined time interval a fifth magnetic field gradient pulse wherein said fifth magnetic field gradient pulse provides a predetermined contribution to the phase of said excited nuclear spins that is distinct from the contribution provided by said first magnetic field;

(m) irradiating said imaging sample with a third 180° RF pulse during an eleventh predetermined time interval so as to initiate another rephasing of said excited nuclear spins, whereupon the orientation of at least said second group of excited nuclear spins is changed by 180°;

(n) applying for a twelfth predetermined time interval a sixth magnetic field gradient pulse wherein said sixth magnetic field gradient pulse cancels the effective phase contribution to said second group of spins from said fifth magnetic field gradient but does not effectively cancel the residue phase from said first magnetic field gradient pulse; and (o) applying during a thirteenth predetermined time interval, a third imaging gradient such that a nuclear spin-echo occurs that is caused by the refocusing of the excited nuclear spins except that the residue phase of said second group of nuclear spins causes said second group of nuclear spins to not refocus during the time of the sampling said nuclear spin-echo signal, thereby preventing the formation of an image from said second group of nuclear spins.

27. The method of claim 26 wherein said first, second, third and fourth magnetic field gradient pulses occur along said first axis.

28. The method of claim 26 wherein at least said third and fourth magnetic field gradient pulses include components along said first axis and along a second axis orthogonal to said first axis.

29. The method of claim 25 wherein the phase contribution by said first and third magnetic field gradient pulses are of equal magnitude.

30. The method of claim 26 wherein said first and fifth magnetic field gradient pulses have the same polarity but said fifth magnetic field gradient has a phase contribution of greater magnitude.

31. The method of claim 25 wherein said RF pulse for exciting a plurality of nuclear spins in a region is a selective RF pulse applied in the presence of a magnetic seventh.

* * * * *